(12) United States Patent
Yu et al.

(10) Patent No.: US 8,653,653 B2
(45) Date of Patent: Feb. 18, 2014

(54) HIGH DENSITY THREE DIMENSIONAL SEMICONDUCTOR DIE PACKAGE

(75) Inventors: Cheeman Yu, Madison, WI (US); Chih-Chin Liao, Changhua (TW); Hem Takiar, Fremont, CA (US)

(73) Assignee: SanDisk Technologies Inc., Plano, TX (US)

( * ) Notice: Subject to any disclaimer, the term of this patent is extended or adjusted under 35 U.S.C. 154(b) by 206 days.

(21) Appl. No.: 12/648,697

(22) Filed: Dec. 29, 2009

(65) Prior Publication Data

US 2010/0102440 A1     Apr. 29, 2010

Related U.S. Application Data (63) Continuation of application No. 11/264,889, filed on Nov. 2, 2005, now Pat. No. 7,663,216.

(51) Int. Cl.
*H01L 23/34* (2006.01)

(52) U.S. Cl.
USPC .......................................................... 257/723

(58) Field of Classification Search
USPC ................................ 257/600–699, 700–799, 257/E23.001–23.194
See application file for complete search history.

(56) References Cited

U.S. PATENT DOCUMENTS

| | | | |
|---|---|---|---|
| 4,982,265 A | | 1/1991 | Watanabe |
| 4,996,583 A | | 2/1991 | Hatada |
| 5,028,986 A | * | 7/1991 | Sugano et al. ................. 257/668 |
| 5,434,745 A | * | 7/1995 | Shokrgozar et al. .......... 361/735 |
| 6,486,528 B1 | * | 11/2002 | Pedersen et al. .............. 257/529 |
| 2001/0009505 A1 | * | 7/2001 | Nishizawa et al. ........... 361/737 |

FOREIGN PATENT DOCUMENTS

| | | |
|---|---|---|
| EP | 0383296 A2 | 8/1990 |
| WO | 9804107 A1 | 1/1998 |
| WO | 2004010500 A1 | 1/2004 |
| WO | 2004055895 A1 | 7/2004 |
| WO | 2005101941 | 10/2005 |

OTHER PUBLICATIONS

English translation of Office Action dated Dec. 21, 2009 issued in Taiwan Patent Application No. 095140456.
Office Action dated Apr. 15, 2010 in Korean Application No. 10-2008-7013352.

(Continued)

*Primary Examiner* — Shaun Campbell
(74) *Attorney, Agent, or Firm* — Vierra Magen Marcus LLP (57) ABSTRACT

A semiconductor package is disclosed including a plurality semiconductor die mounted on stacked and bonded layers of substrate, for example polyimide tape used in tape automated bonding processes. The tape may have a plurality of repeating patterns of traces and contact pads formed thereon. The traces each include aligned interconnect pads on the respective top and bottom surfaces of the substrate for bonding the traces of one pattern to the traces of another pattern after the patterns have been singulated from the substrate, aligned and stacked. Semiconductor die such as flash memory and a controller die are mounted on the traces of the respective patterns on the substrate. In order for the controller die to uniquely address a specific flash memory die in the stack, a group of traces on each substrate supporting the memory die are used as address pins and punched in a unique layout relative to the layout of the traces other substrates. By providing each flash memory semiconductor die on a substrate with a unique layout of address traces, each memory die may be selectively addressed by the controller die.

12 Claims, 6 Drawing Sheets

(56) References Cited

OTHER PUBLICATIONS

Office Action dated Jun. 13, 2010 in Chinese Application No. 200680045630.4.
Written Argument and Amendments filed Aug. 16, 2010 in Korean Application No. 10-2008-7013352.
International Search Report dated May 31, 2007, PCT Application No. PCT/US2006/042664.
Chinese Office Action dated Aug. 27, 2009, Chinese Application No. 200680045630.4.
Office Action dated Apr. 4, 2008, U.S. Appl. No. 11/264,889.
Response to Office Action dated May 5, 2008, U.S. Appl. No. 11/264,889.
Office Action dated Aug. 6, 2008, U.S. Appl. No. 11/264,889.
Response to Office Action dated Sep. 29, 2008, U.S. Appl. No. 11/264,889.
Office Action dated Jan. 6, 2009, U.S. Appl. No. 11/264,889.
Response to Office Action dated Mar. 6, 2009, U.S. Appl. No. 11/264,889.
Advisory Action dated Mar. 24, 2009, U.S. Appl. No. 11/264,889.
Response to Office Action dated Jul. 15, 2009, U.S. Appl. No. 11/264,889.

\* cited by examiner

HIGH DENSITY THREE DIMENSIONAL SEMICONDUCTOR DIE PACKAGE

CLAIM OF PRIORITY

This application is a continuation application of U.S. patent application Ser. No. 11/264,889, filed on Nov. 2, 2005, entitled "High Density Three Dimensional Semiconductor Die Package," now U.S. Publication No. 2007-0096266A1, incorporated herein by reference.

BACKGROUND OF THE INVENTION

1. Field of the Invention

Embodiments of the present invention relate to a semiconductor package formed of multiple semiconductor die stacked on substrate layers in a three dimensional arrangement.

2. Description of the Related Art

The strong growth in demand for portable consumer electronics is driving the need for high-capacity storage devices. Non-volatile semiconductor memory devices, such as flash memory storage cards, are becoming widely used to meet the ever-growing demands on digital information storage and exchange. Their portability, versatility and rugged design, along with their high reliability and large capacity, have made such memory devices ideal for use in a wide variety of electronic devices. These devices include for example digital music players, cellular phones, handheld PCs, digital cameras, digital video camcorders, smart phones, car navigation systems and electronic books.

Flash memory storage cards come in a number of different configurations, but generally include a semiconductor package housed within a standard sized and shaped enclosure. These standard enclosures include SD (Secure Digital) cards, Compact Flash, a Smart Media, a Mini SD Card, an MMC, an xD Card, a Transflash memory card or a Memory Stick. The semiconductor package used in such memory devices includes an integrated circuit typically having passive components, one or more memory chips and, in some configurations, a controller chip mounted on and electrically connected to a substrate. Substrates on which the integrated circuit may be formed include printed circuit boards, leadframes and polyimide tapes. Once formed on the substrate, these integrated circuits are typically encapsulated in a molding compound which protects the integrated circuit and removes heat from the package.

Where once memory devices included a plurality of discrete semiconductor packages, each handling different functions, currently a plurality of integrated circuit components may be packaged together to provide a complete electronic system in a single package. For example, multichip modules ("MCM") typically include a plurality of chips mounted side by side on a substrate and then packaged. Another example is a system-in-a-package ("SiP"), where a plurality of chips may be stacked on a substrate and then packaged.

With form factors being fixed for most of the standard memory cards currently in use, there are generally only two ways to increase the memory density within a card: use higher density memory chips, and stack more memory die in a single package. As the memory card space is limited, the method of stacking more memory chips in a package is getting more difficult and expensive.

Another concern with fabricating stacked memory die in packages is the stresses to which the stacked die are subjected during the encapsulation process. Encapsulation equipment may output an injection force of about 0.8 tons to drive the molding compound into the mold cavity. For die having a footprint of about 4.5 mm by 2.5 mm, this injection force may result in a pressure down on the die of about 1.2 kgf/mm². In the past, semiconductor die were better able to withstand the stress generated during the molding process. However, die thicknesses have been reduced to a range of about 2 mils to 13 mils. At these thicknesses, the die are often not able to withstand the stresses generated during the encapsulation process, and fractures in one or more of the die, known as die cracking, may occur.

A further concern with stacked memory die is that die are tested after they are stacked together and mounted on the substrate. If one of the die turns out to be defective, due to die cracking or any other reason, the entire die stack must be discarded.

SUMMARY OF THE INVENTION

Embodiments of the present invention relate to a semiconductor package including a plurality semiconductor die mounted on stacked and bonded layers of substrate, for example polyimide tape used in tape automated bonding processes. The tape may be provided from a reel having a plurality of repeating patterns of traces and contact pads formed thereon. The traces each include aligned interconnect pads on the respective top and bottom surfaces of the substrate for bonding the traces of one pattern to the traces of another pattern after the patterns have been singulated, aligned and stacked.

While still part of the reel, a plurality of semiconductor die may be mounted on the patterns of the substrate. In embodiments, the semiconductor die may comprise a flash memory array. A controller die such as an ASIC may be mounted on patterns from a second reel of tape. The pattern of conductive traces on the reels of tape are formed in the substrate so that the conductive traces align with each of the die bond pads on the semiconductor die to allow direct bonding of the die to the substrate.

Once the flash memory die are mounted on the substrate, the substrate may be singulated into layers and stacked together. However, in order for the controller die to uniquely address a specific flash memory die in the stack, a group of traces on each substrate supporting a memory die are used as address pins and punched in a unique layout relative to the layout of the traces other substrates. A hole may be punched through the substrate across one or more of the address traces to electrically isolate selected die bond pad. By providing each flash memory semiconductor die on a substrate with a unique layout of address traces, each memory die may be selectively addressed by the controller die.

After singulation, the substrate layers are aligned and stacked. When the patterns are aligned, one on top of the other, corresponding traces and interconnect pads from the different substrate layers may be aligned with each other. The aligned interconnect pads from respective traces may then bonded together in to form an integrated semiconductor package. The completed semiconductor package may be mounted within a pair of lids to form a finished flash memory card, or another device according to the function of the semiconductor die forming the package. The lids may be bonded together by known methods including ultrasonic welding.

DETAILED DESCRIPTION

Embodiments of the invention will now be described with reference to FIGS. 1 through 11 which relate to a semiconductor package including stacked and bonded layers of integrated circuit substrates. It is understood that the present invention may be embodied in many different forms and should not be construed as being limited to the embodiments set forth herein. Rather, these embodiments are provided so that this disclosure will be thorough and complete and will fully convey the invention to those skilled in the art. Indeed, the invention is intended to cover alternatives, modifications and equivalents of these embodiments, which are included within the scope and spirit of the invention as defined by the appended claims. Furthermore, in the following detailed description of the present invention, numerous specific details are set forth in order to provide a thorough understanding of the present invention. However, it will be clear to those of ordinary skill in the art that the present invention may be practiced without such specific details.

Figure 1:
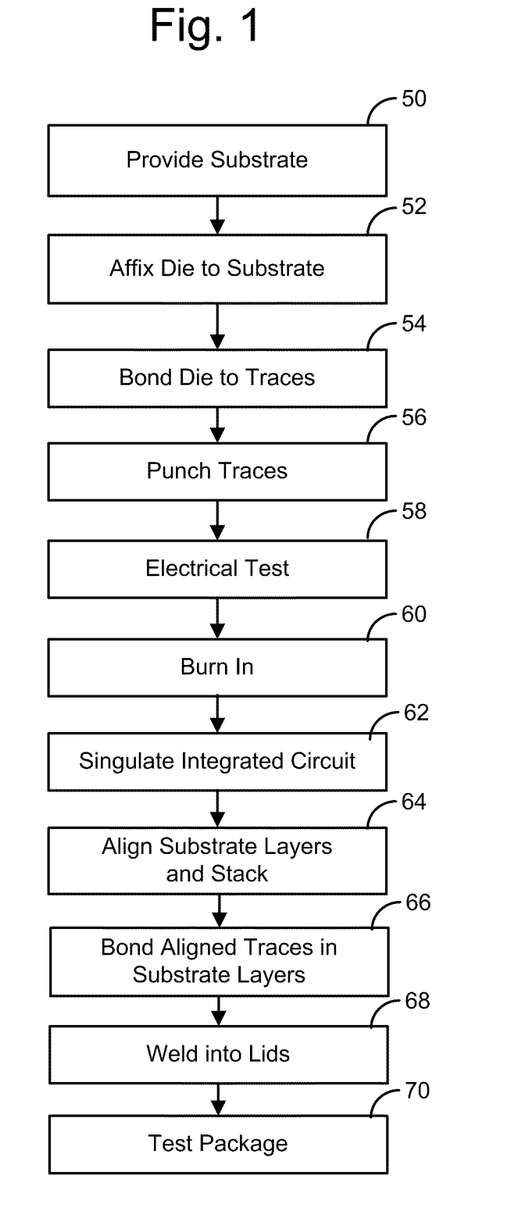
FIG. 1 is a flowchart of a method of fabricating a flash memory card according to embodiments of the present invention.

A method for forming a flash memory card according to embodiments of the present invention will now be described with reference to the flowchart of FIG. 1. The fabrication process begins in step 50 with a substrate 100, a length of which is shown for example in the top, bottom and end views of FIGS. 2 through 4, respectively. In embodiments, substrate 100 may be a tape typically used in tape automated bonding ("TAB") processes. Such tapes are conventionally available in reel-to-reel configurations, and in embodiments may include a thin, flexible dielectric core 102, such as polyimide or other dielectric film, having layers 104 and 106 of conductive material formed on the top and bottom of the dielectric core. The conductive layers 104, 106 may either be electrodeposited on core 102, or rolled sheets of the conductive layers 104, 106 may be attached to core 102 using an adhesive. Layers 104, 106 may be copper or copper alloys, Alloy 42 (42Fe/58Ni), copper plated steel, or other metals and materials known for use on TAB tapes. Layers 104, 106 may additionally be plated with silver, gold, nickel palladium, copper or other materials for enhancing the bonding properties of the traces formed on layers 104, 106 as explained hereinafter.

Core 102 may have a thickness of between 50 to 100 microns (μm), and more particularly 75 to 85 μm. Layers 104, 106 may be ½ ounce copper with a thickness ranging between 50 to 100 μm, and more particularly between 60 and 80 μm. It is understood that the thicknesses of the core and conductive layers may vary above and below the above-described ranges in alternative embodiments of the invention.

Figure 2:
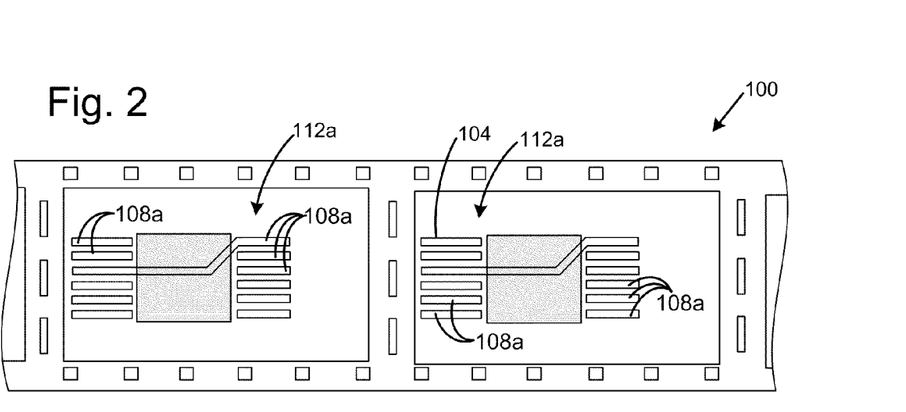
FIG. 2 is a top view of a length of a substrate for supporting a semiconductor die according to embodiments of the invention.
Figure 3:
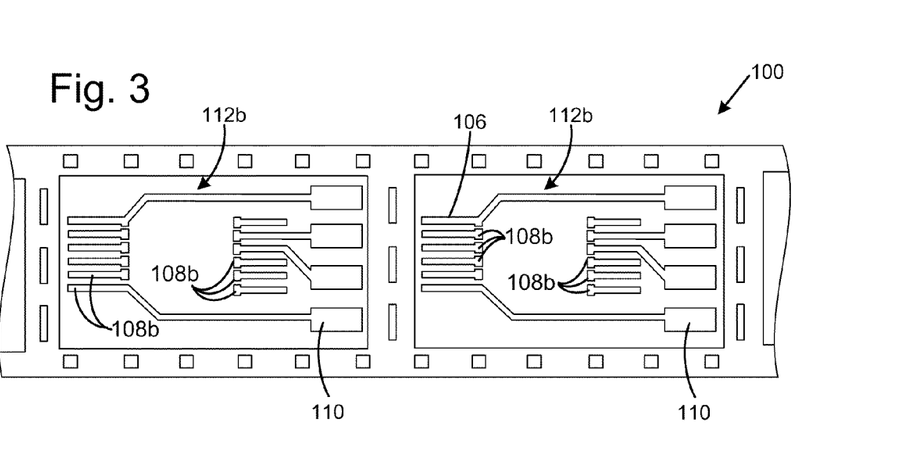
FIG. 3 is a bottom view of a length of a substrate for supporting a semiconductor die according to embodiments of the invention.
Figure 4:
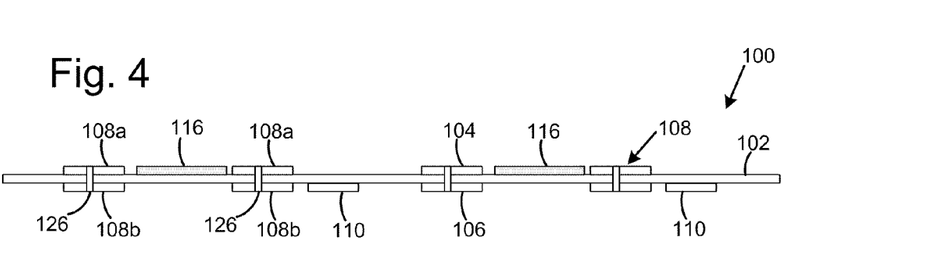
FIG. 4 is a side view of a length of a substrate for supporting a semiconductor die according to embodiments of the invention.

A conductance pattern may be formed in layers 104, 106 on the dielectric core 102 in known processes such as chemical etching. In chemical etching, a photoresist film may be applied to conductive layers 104, 106. A pattern photomask containing the pattern of conductive traces to be formed in layers 104, 106 may then be applied over the photoresist film. The photoresist film may then be exposed and developed to remove the photoresist from areas on the conductive layers that are to be etched. The exposed areas are next etched away using an etchant such as ferric chloride or the like to define the conductive traces and desired patterns in layers 104, 106. The photoresist may then be removed. Other known chemical etching processes may be used. The pattern formed on layers 104, 106 may include electric traces 108 and contact pads 110 used as explained hereinafter.

Where substrate 100 is a TAB tape, the tape may be provided from a reel having a plurality of repeating patterns 112 of traces 108 and contact pads 110 formed thereon. As used herein, pattern 112 may refer to all of the traces 108 or a subgroup of traces 108 in the pattern. Pattern 112a is formed on a top surface of the substrate and pattern 112b is formed on the bottom surface. Two instances of the pattern 112 are shown in FIGS. 2 through 4, but a reel of substrate 100 may have a large number of such patterns. Traces 108 on the top surface of the substrate (traces 108a) are electrically connected to corresponding traces 108 on the bottom surface of the substrate (traces 108b) by a plated through-plugged via 126 (FIG. 4) formed through the core 102. Traces 108a, 108b each include aligned interconnect pads on the respective top and bottom surfaces of substrate 100 for bonding the traces of one pattern 112 to the traces of another pattern 112 after the patterns have been singulated, aligned and stacked as explained hereinafter.

The polyimide tape substrate 100 may have a width of 35 mm, 48 mm, or 70 mm, but it is understood that the width of polyimide tape substrate 100 may be different than those dimensions in alternative embodiments of the present invention. Using a TAB tape as substrate 100 provides advantages of tight pitch of the conductive traces 108 formed thereon. Line pitches of 45 μm are known to be achievable on TAB tapes. This allows for high density circuits. However, as explained hereinafter, it is understood that other media may be used for substrate 100 in alternative embodiments, including leadframes and printed circuit boards.

Figure 5:
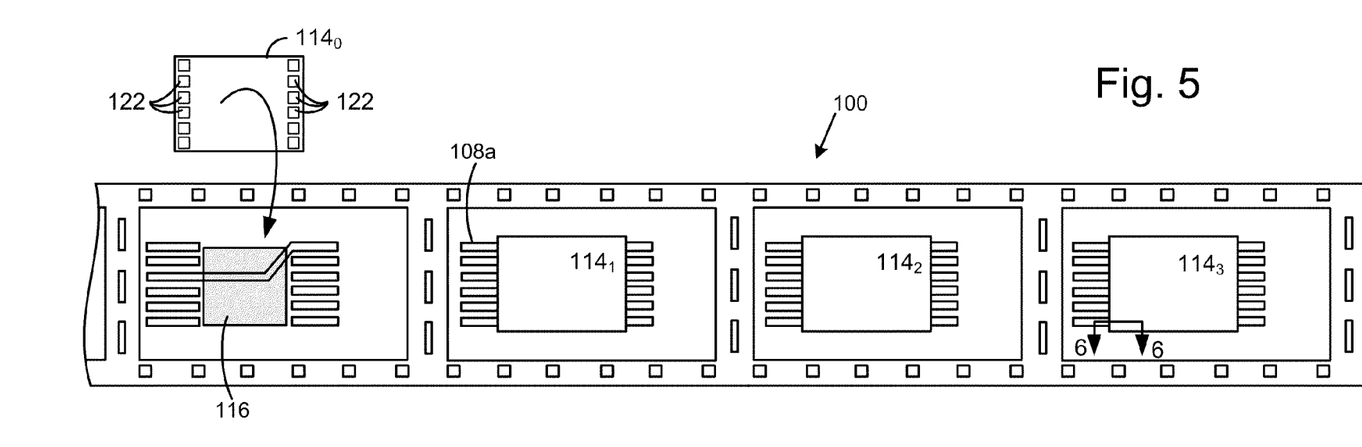
FIG. 5 is a top view of a length of a substrate having a semiconductor die mounted thereon according to embodiments of the invention.

Referring now to FIG. 5, a plurality of semiconductor die 114 may be mounted on substrate 100, one semiconductor die per pattern 112, along the length of substrate 100. In embodiments, semiconductor die 114 may comprise a flash memory array (e.g., NOR, NAND, or other type of flash memory). Such semiconductor die typically include a row of die bond pads 122 along opposed sides of an upper surface of the die. The pattern of conductive traces 108a is formed in the top layer 104 so that the conductive traces align with each of the die bond pads 122 on opposite sides of the semiconductor die 114 to allow the die bond pads 122 to be bonded to the traces when the semiconductor die 114 is flipped over and bonded to the substrate 100 as explained hereinafter. For simplicity, FIGS. 2 and 3 show ten die bond pads 122 and conductive traces 108 (5 on each side). However, it is understood that each die and pattern formed on the respective upper and lower surfaces of substrate 100 may include many more than ten traces in alternative embodiments. For example, a flash memory chip may typically include between ten and fifteen die bond pads on each of the two opposed sides of the die. In such embodiments, substrate 100 would be formed with a like number of conductive traces 108.

In embodiments, each instance of a pattern 112 in a reel of substrate 100 may be identical to each other pattern 112 from that reel. The pattern may be customized for a particular semiconductor die 114, such as for example a given flash memory chip. Thus, in embodiments, each semiconductor die 114 mounted to respective patterns 112 on substrate 100 shown in FIGS. 2 through 4 may be identical to each other. As explained hereinafter, semiconductor die 114 are mounted to substrate 100, singulated and stacked to form a package. It is understood that different types of semiconductor die may be included within the stacked package.

Figure 9:
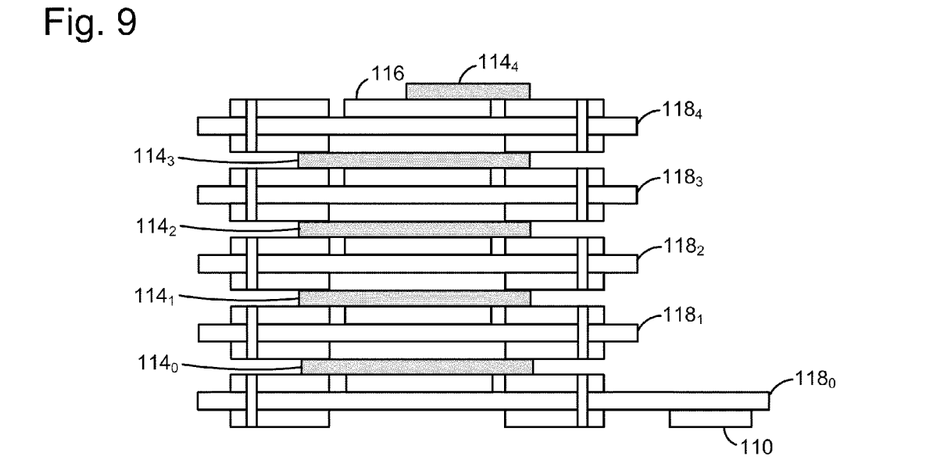
FIG. 9 is a side view of the singulated integrated circuit substrate layers stacked according to embodiments of the invention.
Figure 10:
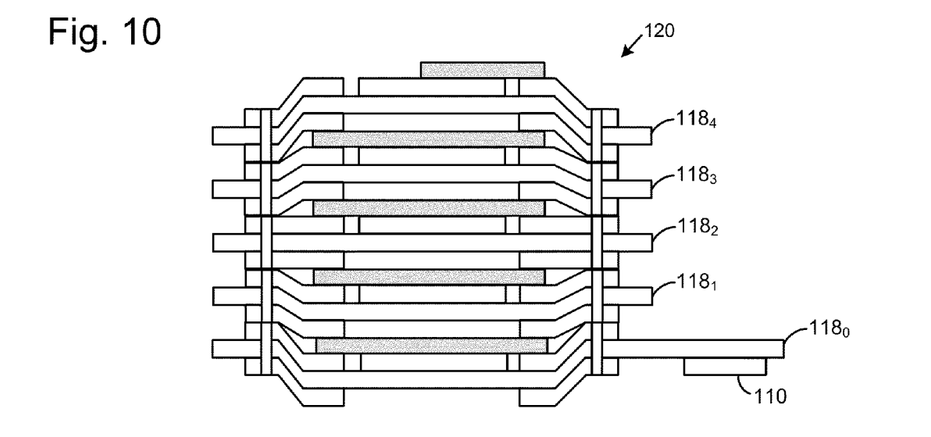
FIG. 10 is a side view of the stacked integrated circuit substrate layers bonded together according to embodiments of the invention.
Figure 11:
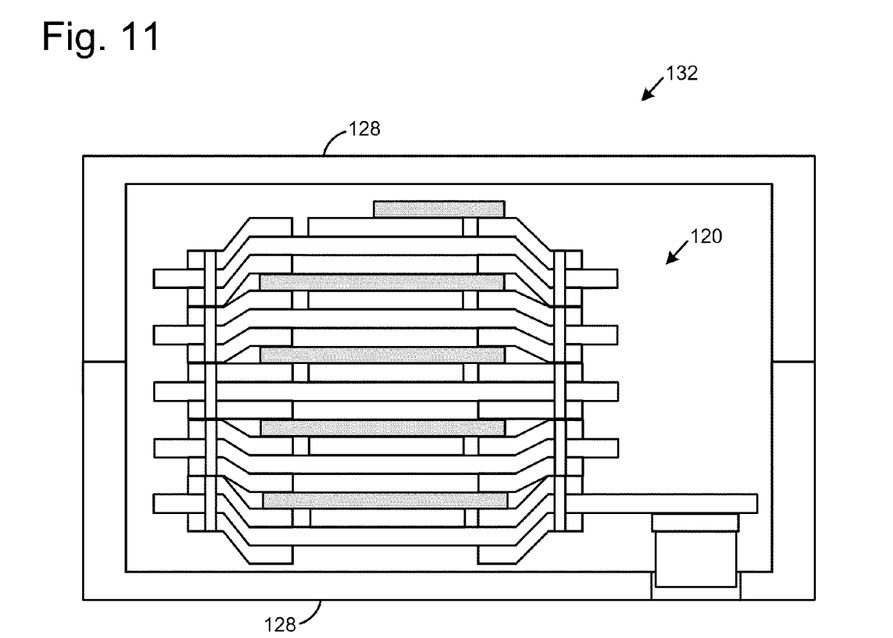
FIG. 11 is a side view of the bonded integrated circuit stack seated within a lid according to embodiments of the invention.

For example, in embodiments, the stacked package may also include a controller chip $114_4$ as shown in FIGS. 9 through 11 for controlling read, write, and operation of the plurality of flash memory chips. The controller chip $114_4$ may for example be an ASIC. As is known in the art, such controller chips would typically include a different die bond pad configuration on the upper surface of the chip than would a flash memory chip. For example, an ASIC chip may include between 40 and 80 die bond pads around the edges of the upper surface of the chip. Accordingly, the substrate 100 to which such a controller chip would be mounted would come from a separate substrate reel, having a pattern customized to that controller chip bond pad configuration. The pattern used on substrate 100 for attaching to a controller chip is known in the art.

Thus, in embodiments, a plurality of flash memory chips may be mounted to respective instances of pattern 112 on a first reel of substrate 100 shown in FIGS. 2 through 4 in a first process, and a plurality of controller chips may be mounted to instances of patterns formed on a second reel (not shown) of substrate 100, and the flash memory chips and controller chips brought together in a stacked configuration after bonding to the respective substrates and singulation as explained hereinafter. It is understood that the type of semiconductor die which may be used in accordance with the principles of the present invention is not limited to flash memory chips or controllers in alternative embodiments of the present invention. Moreover, while a single reel of substrate may have all identical patterns as described above, it is contemplated that a single reel of substrate could include different patterns to accept different semiconductor die in alternative embodiments.

The steps for forming flash memory chips on the substrate 100 shown in FIGS. 2 through 4 are explained hereinafter. It is understood that the process for forming controller chips on a substrate may be similar to the steps described hereinafter for forming flash memory chips on substrate 100. Referring again to the flow diagram in FIG. 1, in step 52, die 114 are affixed to the upper surface of substrate 100. FIG. 5 shows four semiconductor die $114_{0-3}$, with die $114_{1-3}$ affixed to respective instances of pattern 112 on substrate 100, and die $114_0$ ready to be flipped and attached to substrate 100. It is understood that more or less than four semiconductor die may be affixed to substrate 100 in alternative embodiments. As is known, substrate 100 may advance through a die attach tool capable of affixing semiconductor die 114 to substrate 100 one at a time or batch processes a number at a time. Each pattern 112 on substrate 100 may include a die attach adhesive 116 for affixing die 114 to substrate 100. Adhesive 116 may be polyimide, epoxy, and/or other known materials for mounting semiconductor die to a substrate such as a TAB tape.

Figure 6:
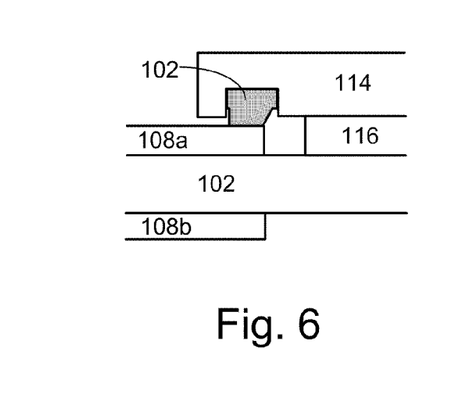
FIG. 6 is a cross-sectional view through line 6-6 in FIG. 5.

As discussed above, the die are mounted to the patterns 112 on substrate 100 so that the die bond pads 122 on the surface of die 114 lie adjacent to respective traces 108a. Once a semiconductor die 114 is mounted to the adhesive on a pattern 112, the die bond pads may be bonded to the respective traces 108 in step 54 and as shown in FIG. 6. Die bond pads may be bonded to traces 108 in a known bonding process, such as for example in a single point thermosonic bond process where each bond pad position is individually bonded using heat, time, force, and ultrasonics applied to trace 108 and its respective bond pad. Alternatively, a known gang bonding process which uses thermo-compression to bond all of the traces to their respective bond pads at the same time may be used. As indicated above, traces 108 may be plated with gold or other material to enhance the bond between traces 108 and their respective die bond pads.

As explained hereinafter, the semiconductor and trace assemblies will be singulated from substrate 100 and stacked so that traces in one layer align with the corresponding traces in the next adjacent layer. Once aligned, corresponding traces in the respective layers are bonded together at their interconnect pads. In the finished assembly, in order for the controller die to uniquely address a specific memory die $114_0$, $114_1$, $114_2$, or $114_3$, a group of traces 108 on each pattern 112 are used as address pins and punched in a unique layout in step 46 relative to the other patterns. That is, referring to FIG. 7, each of four patterns 112 in substrate 100 receiving semiconductor die $114_{0-3}$ may include address traces $at_0$, $at_1$, $at_2$, and $at_3$. It is understood in embodiments including greater or fewer than four semiconductor die 114, there may be a correspondingly greater or fewer number of address traces.

Figure 7:
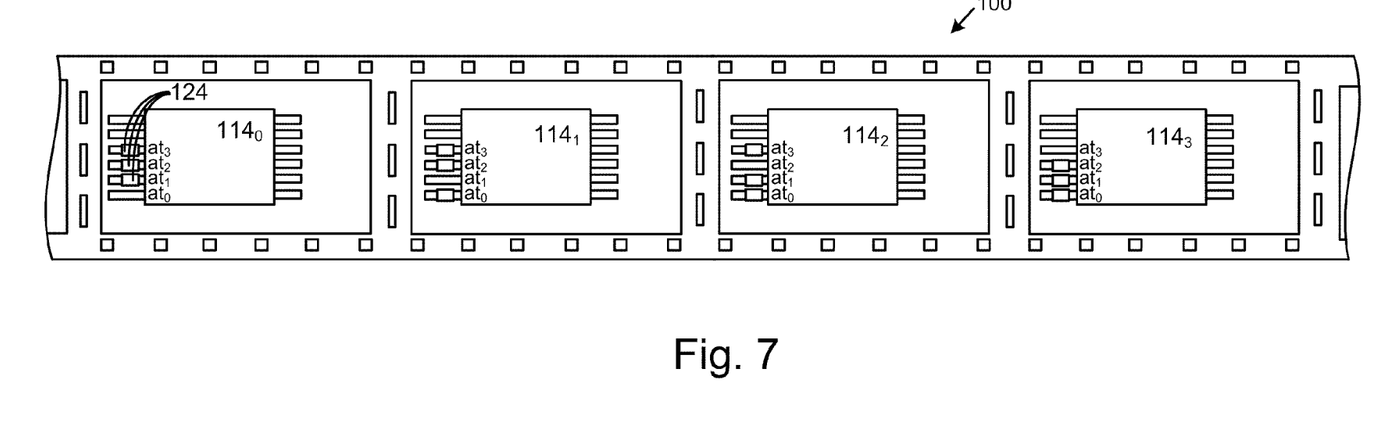
FIG. 7 is a top view of a length of a substrate with selected electrical traces punched according to embodiments of the invention.

As shown in FIG. 7, semiconductor die $114_0$ may have traces $at_1$, $at_2$, and $at_3$ punched. That is, a hole 124 may be punched through substrate 100 across traces $at_{1-3}$, to electrically isolate the die bond pad 122 at traces $at_{1-3}$, and prevent signal transfer to or from those die bond pads. Similarly, semiconductor $114_1$ may have traces $at_0$ and $at_{2-3}$ punched. Semiconductor die $114_2$ may have traces $at_{0-1}$ and $at_3$ punched and semiconductor die $114_3$ may have address traces $at_{0-2}$ punched. It is understood that the specific layout of punched address traces shown in FIG. 7 is by way of example only, and other layouts of punched address traces would be understood so long as no two semiconductor die $114_{0-3}$ have an identical layout of punched traces. It is also contemplated that for a given number of semiconductor die, such as for example the four shown in FIG. 7, there may be more than four address traces. In such an embodiment, it would be appreciated that the pattern of punched traces may vary, so long as each semiconductor die is provided with a unique pattern of punched traces relative to the other semiconductor die.

Once substrate 100 has been punched as described above, the respective semiconductor die may be tested in step 58. Unlike conventional stacked semiconductor die, if one of the semiconductor die 114 is defective, that semiconductor die 114 may be discarded without having to discard the remaining semiconductor die 114. Testing may be performed in a known process for testing electrical performance in semiconductor die. Burn-in may also be performed in step 60 to detect which if any of the die fail under electrical and/or thermal stresses.

Figure 8:
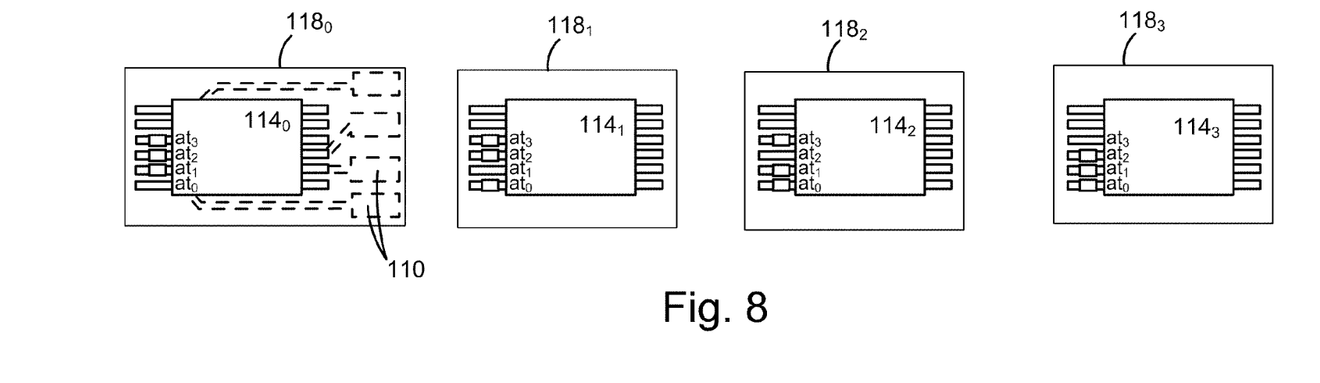
FIG. 8 is a top view of the integrated circuit substrate layer singulated from the length of a substrate according to embodiments of the invention.

Semiconductor die 114 which pass the electrical test and burn-in may be singulated from substrate 100 in step 62 and as shown in FIG. 8. As indicated, the substrate 100 which is to form the bottom layer of the stack may be singulated with dimensions that include contact pads 110 on the bottom layer 106 (shown in phantom in FIG. 8). The contact pads 110 will be used for communication between the finished package and external electronic devices. The remaining singulated layers including die $114_{1-3}$ may be cut to a smaller size that does not include the contact pads 110. It is understood that any of the semiconductor die $114_{0-3}$ may be the lower-most layer in the stack, and be singulated to include contact pads 110. Moreover, it is possible that a layer other than the lowermost layer would be the layer to include contact pads 110 for external connection of the device.

The respective patterns are singulated into substrate layers $118_{0-3}$ carrying semiconductor die $114_{0-3}$. The substrate layers $118_{0-3}$ are then aligned and stacked in step 64 and as shown in the end view of FIG. 9. A further substrate layer $118_4$ including a different semiconductor die $114_4$, which may be an ASIC or other controller as discussed above, is also stacked with layers $118_{0-3}$ as shown.

As indicated above, all of the layers from a single roll of substrate 100 have an identical trace pattern. When the patterns are aligned, one on top of the other, corresponding traces and interconnect pads from the different substrate layers 118 may be aligned with each other. The aligned interconnect pads from respective traces are then bonded together in step 66 to form an integrated package 120 as shown in FIG. 10.

In particular, the interconnect pads formed on traces 108a on the top of a first substrate layer align with and are bonded to the interconnect pads on traces 108b in the bottom of a next adjacent substrate layer. The interconnect pads of the respective substrate layers may be bonded using known bonding techniques such as ultrasonic welding or soldering using a reflow oven. Other bonding techniques are contemplated.

Once a column of aligned, corresponding traces in respective substrate layers 118 are bonded together, the aligned, corresponding traces in the respective layers are electrically coupled. Thus, current sent to a particular trace will be routed to each corresponding trace in each layer of the package 120. This is true unless a trace in a given substrate layer has been punched as described above. For those traces which have punched out holes 124, the punched holes are located between the interconnect pads and the bond site of traces 108 with the die bond pads 122 on the semiconductor die. Thus, a punched trace will communicate an electrical signal to the next adjacent layer, but will not communicate the electrical signal to its bonded die pad.

Through the above-described arrangement of bonded and punched traces, signals may be both universally and selectively communicated between controller die $114_4$ and the flash memory die $114_{0-3}$. For example, power and ground currents may be universally communicated to/from a designated die bond pad of all flash memory die along the path established by corresponding bonded interconnect pads. Likewise, read, write, and other data or instructions may be selectively addressed by controller die $114_4$ to any one of the memory die $114_{0-3}$ as a result of the pattern of punched out areas 124 on address traces $at_{0-3}$.

For example, if controller die $114_4$ was to address one of the memory die, for example, die $114_2$, with the punch pattern shown in FIG. 7, the controller die could send a signal along address trace $at_2$. As memory die $114_0$, $114_1$, $114_3$ all have address trace $at_2$ punched, the signal would reach only memory die $114_2$, and none other. As indicated above, a controller die $114_4$ may have many more die bond pads and traces than die $114_{0-3}$ and substrate layers 118. Thus, controller die $114_4$ may send and receive signals along paths independently of those used by the memory die $114_{0-3}$.

Once integrated, the package 120 may be mounted within lids 128 in step 68 and as shown in FIG. 11 to form a finished flash memory card 132. It is understood that package 120 and lids 128 may form other devices, according to the function of the semiconductor die forming package 120. The lids may be bonded together by known methods including ultrasonic welding. Bottom lid 128 includes a plurality of ribs as is known defining openings through which contact pads 110 may be accessed by external electronic devices to provide communication between package 120 and those devices. As contact pads 110 may be recessed within lids 128 due to the bending of the edges of the different substrate layers 118 when bonded together, a conductor 130 may be provided to allow electrical connection between contact pads 110 and external connectors. In embodiments, it is understood that the bottom layer $118_0$ including contact pads 110 may not be bent upward into the package, and contact pads 110 may reside adjacent to the openings in lid 128. Conductor 130 may be omitted in such embodiments. After package 120 is mounted within lids 128, the resulting device may be tested in step 70 and then shipped.

As discussed in the Background of the Invention section, the encapsulation process for semiconductor packages may add cost and complexity to flash memory card manufacture. The encapsulation process also subjects semiconductor die to high compressive and thermal stresses, often resulting in die cracking and non-good die. The flash memory card 132 described above may be fabricated without the encapsulation process. Another frequent cause of die failure is rupturing of the wire bond typically used to connect a die bond pad to a conductive trace on a substrate. By providing a direct connection between the die bond pad and trace according to the present invention, the wire bond process may also be omitted.

The dimensions of package 120 may vary depending on the number of semiconductor die and substrate layers included within the package. However, for a package 120 including four flash memory semiconductor die and one controller die, the package may have an overall height of between 1.4 and 1.6 mm. With this height, the package 120 may be used in a standard flash memory enclosure, including for example an SD card, compact flash, smart media, mini SD card, MMC and xD card, or a memory stick. Other standard flash memory packages are also possible.

As indicated above, in embodiments, substrate 100 may be a polyimide tape. It is further contemplated that substrate 100 could be a leadframe or a printed circuit board. Where substrate 100 is a leadframe, the leadframe edges extending beyond the mounted semiconductor die could be pinched together and bonded to form a package as shown in FIG. 10 as described above. While printed circuit boards are typically not flexible, other methods may be used to connect corresponding interconnect pads of the respective substrate layers of the package shown, for example, in FIG. 9 to form a flash memory or other device as described above.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

We claim:

1. A flash memory package, comprising:

a plurality of flash memory semiconductor die;

a plurality of stacked tape substrate layers, each stacked tape substrate layer including a flash memory semiconductor die of the plurality of semiconductor die, the plurality of stacked tape substrate layers including patterns of electrical traces, an electrical trace of a pattern of electrical traces in a tape substrate layer aligning with a corresponding trace in each other tape substrate layer, the corresponding electrical traces in each stacked tape substrate layer being electrical coupled;

a group of n traces of the pattern of electrical traces in each tape substrate layer, where n is greater than or equal to the number of flash memory semiconductor die in the plurality of flash memory semiconductor die, each group of n traces in each tape substrate layer having a layout defined by one or more severed traces, the layout of one or more severed traces being different with respect to which trace is severed for each group of n traces in each tape substrate layer; and a pair of lids for encasing the plurality of stacked tape substrate layers and group of n traces, the pair of lids encasing the substrate layers and traces without molding compound.

2. A flash memory package as recited in claim 1, the plurality of flash memory devices comprising four flash memory devices.

3. A flash memory package as recited in claim 1, further comprising a controller semiconductor die mounted on an additional tape substrate layer, the additional tape substrate layer stacked on the plurality of stacked tape substrate layers.

4. A flash memory package as recited in claim 3, the plurality of tape substrate layers supporting the flash memory die coming from a first reel of substrates and the additional tape substrate layer coming from a second reel of substrates.

5. A semiconductor package as recited in claim 1, wherein the one or more electrical traces is severed along its length by punching one or more holes through each tape substrate layer.

6. A flash memory card, comprising:
a flash memory package, including:
a plurality of stacked substrate layers, the plurality of stacked substrate layers each including a pattern of electrical traces,
a plurality of flash memory semiconductor die affixed to a stacked substrate layer of the plurality of stacked substrate layers, and
a controller semiconductor die affixed to a stacked substrate layer of the plurality of stacked substrate layers;
wherein a first flash memory semiconductor die on a given stacked substrate layer is uniquely addressable relative to a second flash memory semiconductor die on a second stacked substrate layer by the first stacked substrate layer including a number of sequential electrical traces 1 to n, where n is greater than 1, the trace number 1 in the sequence is a severed trace, and by the second stacked substrate layer including a number of sequential electrical traces 1 to n, the trace number 2 in the sequence is a severed trace; and
a lid in which the flash memory package is encased, the flash memory package lying in direct contact with the lid, without any molding compound between the flash memory package and lid.

7. A flash memory card as recited in claim 6, the flash memory card comprising a secure digital (SD) card.

8. A flash memory card as recited in claim 6, the flash memory card comprising one of a Compact Flash, a Smart Media, a Mini SD Card, an MMC, an xD Card, a Transflash memory card and a Memory Stick.

9. A semiconductor package as recited in claim 6, wherein the one or more of the electrical traces on the given stacked substrate layer is severed by punching one or more holes through the given substrate layer, the one or more holes severing the one or more electrical traces.

10. A semiconductor package as recited in claim 6, wherein the plurality of stacked substrate layers supporting the flash memory semiconductor die are singulated from a first reel of tape used in tape automated bonding processes.

11. A semiconductor package as recited in claim 10, wherein the stacked substrate layer supporting the controller semiconductor die is singulated from a second reel of tape used in tape automated bonding processes.

12. A semiconductor package as recited in claim 6, wherein plurality of stacked substrate layers is five stacked substrate layers and the plurality of flash memory semiconductor die is four semiconductor die.

* * * * *